(12) United States Patent
Nakajima et al.

(10) Patent No.: US 8,654,270 B2
(45) Date of Patent: Feb. 18, 2014

(54) SEMICONDUCTOR DEVICE AND METHOD OF MANUFACTURING THE SEMICONDUCTOR DEVICE

(75) Inventors: Setsuo Nakajima, Kanagawa (JP); Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 212 days.

(21) Appl. No.: 12/199,086

(22) Filed: Aug. 27, 2008

(65) Prior Publication Data

US 2009/0033818 A1 Feb. 5, 2009

Related U.S. Application Data

(62) Division of application No. 09/635,945, filed on Aug. 10, 2000, now abandoned.

(30) Foreign Application Priority Data

Aug. 12, 1999 (JP) .................................. 11-228944

(51) Int. Cl.
*G02F 1/136* (2006.01)

(52) U.S. Cl.
USPC .......................................................... 349/43

(58) Field of Classification Search
USPC .......................................................... 349/43
See application file for complete search history.

(56) References Cited

U.S. PATENT DOCUMENTS

| | | |
|---|---|---|
| 4,914,503 A | 4/1990 | Shirato et al. |
| 5,028,551 A | 7/1991 | Dohjo et al. |
| 5,144,391 A | 9/1992 | Iwata et al. |
| 5,187,602 A | 2/1993 | Ikeda et al. |
| 5,198,694 A | 3/1993 | Kwasnick et al. |
| 5,281,554 A | 1/1994 | Shimada et al. |

(Continued)

FOREIGN PATENT DOCUMENTS

| | | |
|---|---|---|
| EP | 0 466 495 A2 | 1/1992 |
| EP | 0 498 663 A2 | 8/1992 |

(Continued)

OTHER PUBLICATIONS

Nakabu, S. et al, "32.2: The Development of Super-High Aperture Ratio with Low Electrically Resistive Material for High-Resolution TFT-LCDs," SID 99 Digest, Society for Information Display, SID International Symposium Digest of Technical Papers, 1999, pp. 732-735.

(Continued)

*Primary Examiner* — Timothy L Rude
(74) *Attorney, Agent, or Firm* — Husch Blackwell LLP

(57) ABSTRACT

In a semiconductor device, a first interlayer insulating layer made of an inorganic material and formed on inverse stagger type TFTs, a second interlayer insulating layer made of an organic material and formed on the first interlayer insulating layer, and a pixel electrode formed in contact with the second interlayer insulating layer are disposed on a substrate, and an input terminal portion that is electrically connected to a wiring of another substrate is provided on an end portion of the substrate. The input terminal portion includes a first layer made of the same material as that of the gate electrode and a second layer made of the same material as that of the pixel electrode. With this structure, the number of photomasks used in the photolithography method can be reduced to 5.

28 Claims, 10 Drawing Sheets

(56) References Cited

U.S. PATENT DOCUMENTS

| | | |
|---|---|---|
| 5,313,075 A | 5/1994 | Zhang et al. |
| 5,428,250 A | 6/1995 | Ikeda et al. |
| 5,483,082 A | 1/1996 | Takizawa et al. |
| 5,491,352 A | 2/1996 | Tsuji |
| 5,580,796 A | 12/1996 | Takizawa et al. |
| 5,585,295 A | 12/1996 | Wu |
| 5,608,559 A | 3/1997 | Inada et al. |
| 5,636,329 A | 6/1997 | Sukegawa et al. |
| 5,644,147 A | 7/1997 | Yamazaki et al. |
| 5,648,674 A | 7/1997 | Weisfield et al. |
| 5,668,379 A | 9/1997 | Ono et al. |
| 5,731,216 A | 3/1998 | Holmberg et al. |
| 5,734,458 A | 3/1998 | Ikubo et al. |
| 5,739,549 A | 4/1998 | Takemura et al. |
| 5,744,820 A | 4/1998 | Matsushima et al. |
| 5,780,872 A | 7/1998 | Misawa et al. |
| 5,804,501 A | 9/1998 | Kim |
| 5,818,070 A | 10/1998 | Yamazaki et al. |
| 5,821,622 A | 10/1998 | Tsuji et al. |
| 5,825,449 A | 10/1998 | Shin |
| 5,834,345 A | 11/1998 | Shimizu |
| 5,835,177 A | 11/1998 | Dohjo et al. |
| 5,852,481 A | 12/1998 | Hwang |
| 5,867,242 A | 2/1999 | Yao et al. |
| 5,883,682 A | 3/1999 | Kim et al. |
| 5,889,573 A | 3/1999 | Yamamoto et al. |
| 5,899,547 A | 5/1999 | Yamazaki et al. |
| 5,903,326 A | 5/1999 | Lee |
| 5,914,763 A * | 6/1999 | Fujii et al. ............... 349/149 |
| 5,929,948 A | 7/1999 | Ohori et al. |
| 5,930,607 A | 7/1999 | Satou |
| 5,942,767 A | 8/1999 | Na et al. |
| 5,966,190 A | 10/1999 | Dohjo et al. |
| 5,966,589 A | 10/1999 | Watanabe et al. |
| 5,968,850 A | 10/1999 | Jeong et al. |
| 5,972,437 A | 10/1999 | Ohori et al. |
| 5,985,746 A | 11/1999 | Kapoor |
| 6,001,539 A | 12/1999 | Lyu et al. |
| 6,008,065 A | 12/1999 | Lee et al. |
| 6,025,891 A | 2/2000 | Kim |
| 6,028,652 A | 2/2000 | Dohjo et al. |
| 6,043,859 A | 3/2000 | Maeda |
| 6,072,556 A | 6/2000 | Hirakata et al. |
| 6,078,366 A | 6/2000 | Dohjo et al. |
| 6,094,248 A | 7/2000 | Hayashi |
| 6,100,954 A | 8/2000 | Kim et al. |
| 6,121,632 A | 9/2000 | Taguchi et al. |
| 6,124,604 A | 9/2000 | Koyama et al. |
| 6,130,443 A | 10/2000 | Hong et al. |
| 6,163,356 A * | 12/2000 | Song et al. ............... 349/152 |
| 6,166,396 A | 12/2000 | Yamazaki |
| 6,169,593 B1 | 1/2001 | Kanaya et al. |
| 6,172,733 B1 * | 1/2001 | Hong et al. ............... 349/152 |
| 6,188,452 B1 | 2/2001 | Kim et al. |
| 6,198,133 B1 | 3/2001 | Yamazaki et al. |
| 6,198,517 B1 | 3/2001 | Ohori et al. |
| 6,211,928 B1 | 4/2001 | Oh et al. |
| 6,218,206 B1 | 4/2001 | Inoue et al. |
| 6,226,060 B1 | 5/2001 | Onisawa et al. |
| 6,239,854 B1 | 5/2001 | Hirakata et al. |
| 6,246,458 B1 | 6/2001 | Koma et al. |
| 6,262,438 B1 | 7/2001 | Yamazaki et al. |
| 6,297,519 B1 | 10/2001 | Fujikawa et al. |
| 6,338,989 B1 | 1/2002 | Ahn et al. |
| 6,383,327 B1 | 5/2002 | Mase |
| 6,384,818 B1 | 5/2002 | Yamazaki et al. |
| 6,387,737 B1 | 5/2002 | Yamazaki et al. |
| 6,403,980 B1 | 6/2002 | Park |
| 6,407,784 B1 * | 6/2002 | Kanou et al. ............... 349/113 |
| 6,433,842 B1 | 8/2002 | Kaneko et al. |
| 6,444,296 B1 | 9/2002 | Sasaki et al. |
| 6,567,146 B2 | 5/2003 | Hirakata et al. |
| 6,624,864 B1 * | 9/2003 | Kubo et al. ............... 349/139 |
| 6,630,687 B1 | 10/2003 | Koyama et al. |
| 6,660,549 B2 | 12/2003 | Yamazaki et al. |
| 6,709,901 B1 | 3/2004 | Yamazaki et al. |
| 6,747,288 B2 | 6/2004 | Yamazaki et al. |
| 6,762,082 B2 | 7/2004 | Yamazaki et al. |
| 6,806,495 B1 | 10/2004 | Yamazaki et al. |
| 6,806,499 B2 | 10/2004 | Yamazaki et al. |
| 6,855,957 B1 | 2/2005 | Yamazaki et al. |
| 6,900,084 B1 | 5/2005 | Yamazaki |
| 7,102,169 B2 | 9/2006 | Koyama et al. |
| 7,102,718 B1 | 9/2006 | Yamazaki et al. |
| 7,323,717 B2 | 1/2008 | Koyama et al. |
| 7,550,325 B2 | 6/2009 | Koyama et al. |
| 2001/0022677 A1 | 9/2001 | Hirakata et al. |
| 2002/0132396 A1 | 9/2002 | Yamazaki et al. |
| 2003/0138998 A1 | 7/2003 | Yamazaki et al. |
| 2003/0160236 A1 | 8/2003 | Yamazaki et al. |
| 2009/0057683 A1 | 3/2009 | Nakajima et al. |
| 2009/0061574 A1 | 3/2009 | Nakajima et al. |
| 2009/0231533 A1 | 9/2009 | Koyama et al. |

FOREIGN PATENT DOCUMENTS

| | | |
|---|---|---|
| JP | 1-175244 | 7/1989 |
| JP | 2-263474 | 10/1990 |
| JP | 5-47708 | 2/1993 |
| JP | 5-53127 | 3/1993 |
| JP | 6-138487 | 5/1994 |
| JP | 6-138488 | 5/1994 |
| JP | 6-202153 | 7/1994 |
| JP | 06-208137 | 7/1994 |
| JP | 6-235939 | 8/1994 |
| JP | 6-250221 | 9/1994 |
| JP | 7-181514 | 7/1995 |
| JP | 07-263700 | 10/1995 |
| JP | 8-74033 | 3/1996 |
| JP | 9-160076 | 6/1997 |
| JP | 9-232586 | 9/1997 |
| JP | 9-246211 | 9/1997 |
| JP | 9-258198 | 10/1997 |
| JP | 9-279367 | 10/1997 |
| JP | 10-41519 | 2/1998 |
| JP | 10-142636 | 5/1998 |
| JP | 10-198292 | 7/1998 |
| JP | 10-232409 | 9/1998 |
| JP | 10-268347 | 10/1998 |
| JP | 10-270710 | 10/1998 |
| JP | 10-293321 | 11/1998 |
| JP | 11-15022 | 1/1999 |
| JP | 11-52418 | 2/1999 |
| JP | 11-150275 | 2/1999 |
| JP | 11-149093 | 6/1999 |
| JP | 11-153803 | 6/1999 |
| JP | 11-212120 | 8/1999 |
| JP | 11-283934 | 10/1999 |
| JP | 2000-77806 | 3/2000 |

OTHER PUBLICATIONS

Hong, M. et al, "44.1: Invited Paper: New Approaches to Process Simplification for Large Area and High Resolution TFT-LCD," SID 01 Digest, 2001, pp. 1148-1151.

U.S. Appl. No. 09/566,742 to Yamazaki et al filed Jul. 7, 2000, including specification, claims, abstract, drawings, pending claims 1-20 & 22-29, and PTO filing receipt.

Office Action re U.S. Appl. No. 12/258,046, dated Mar. 24, 2010.

Pending claims (Preliminary Amendment B) re U.S. Appl. No. 12/258,046, dated Mar. 18, 2009.

Final Office action re U.S. Appl. No. 12/257,992 dated May 4, 2010.

Peding claims (Amendment C) re U.S. Appl. No. 12/257,992, dated Feb. 9, 2010.

Notice of Allowance re U.S. Appl. No. 12/257,992, dated Mar. 31, 2011.

* cited by examiner

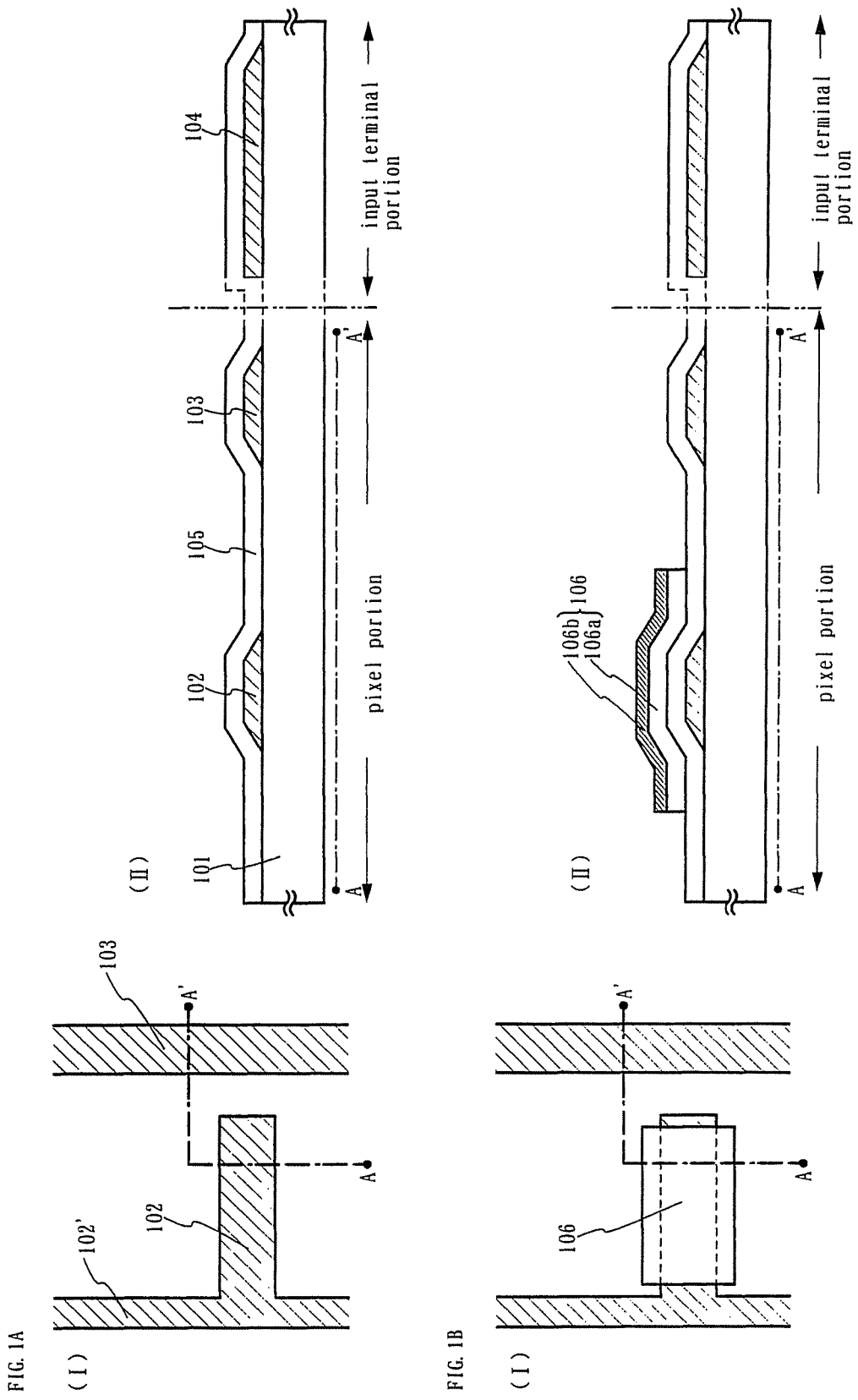

FIG. 2A
(I) 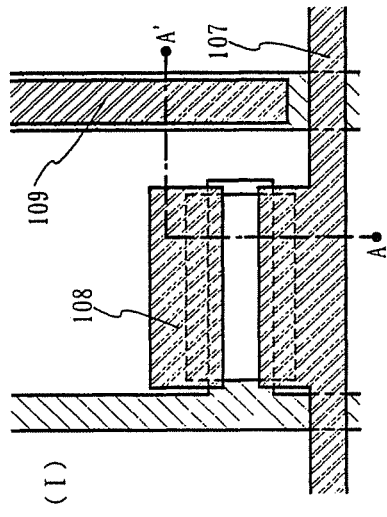
(II) 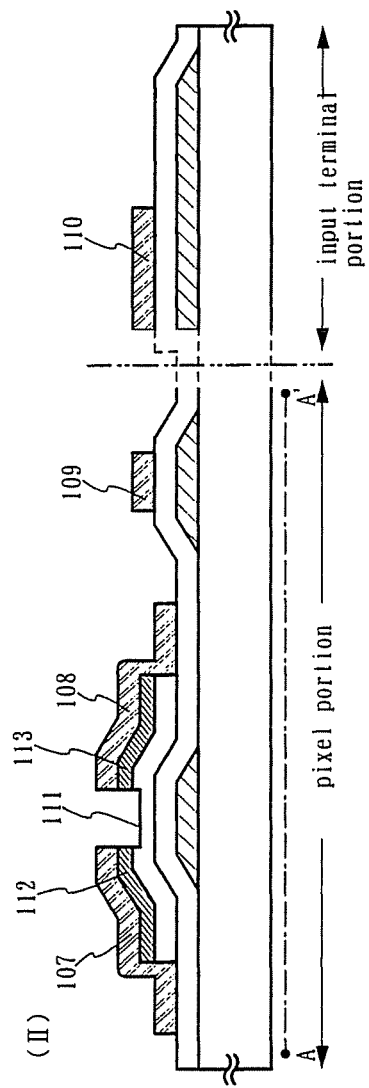
FIG. 2B
(I) 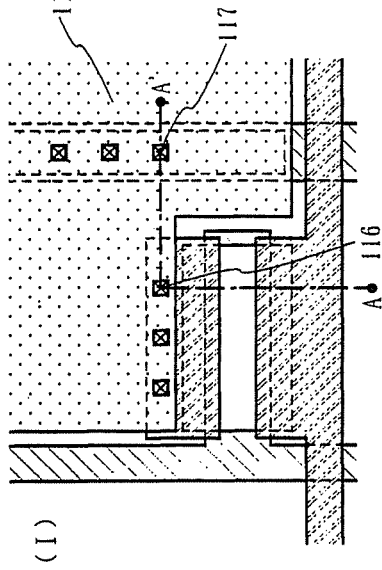
(II) 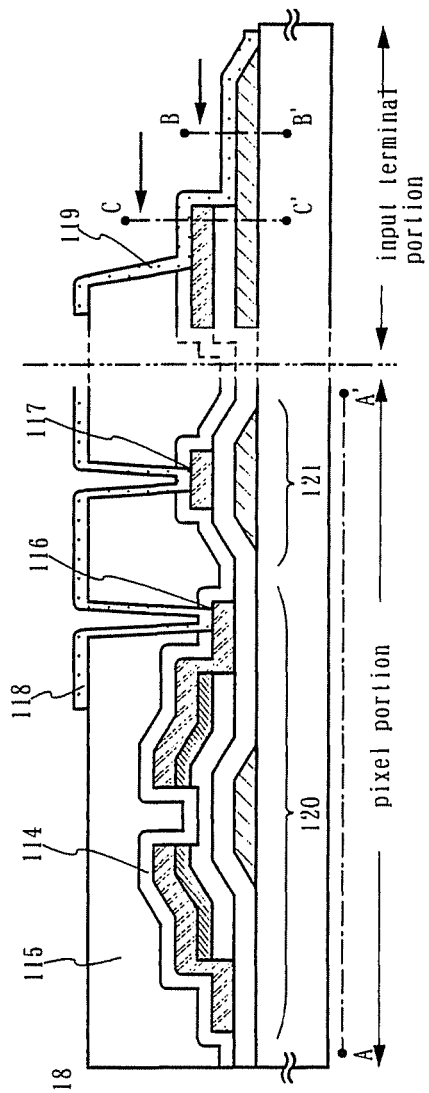

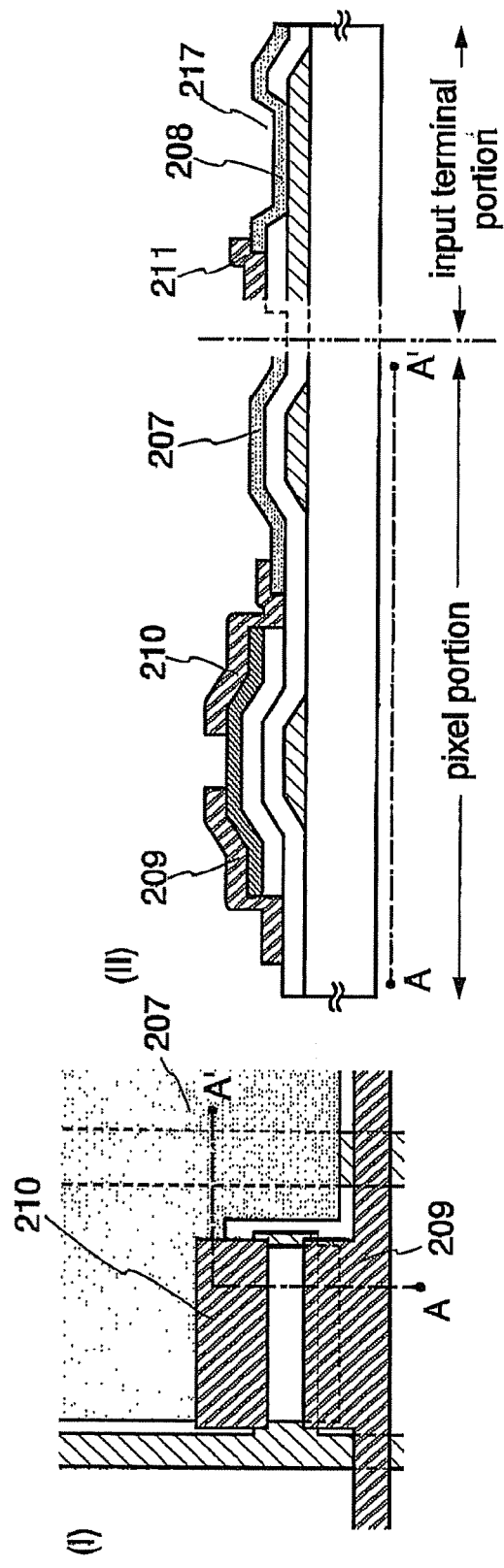
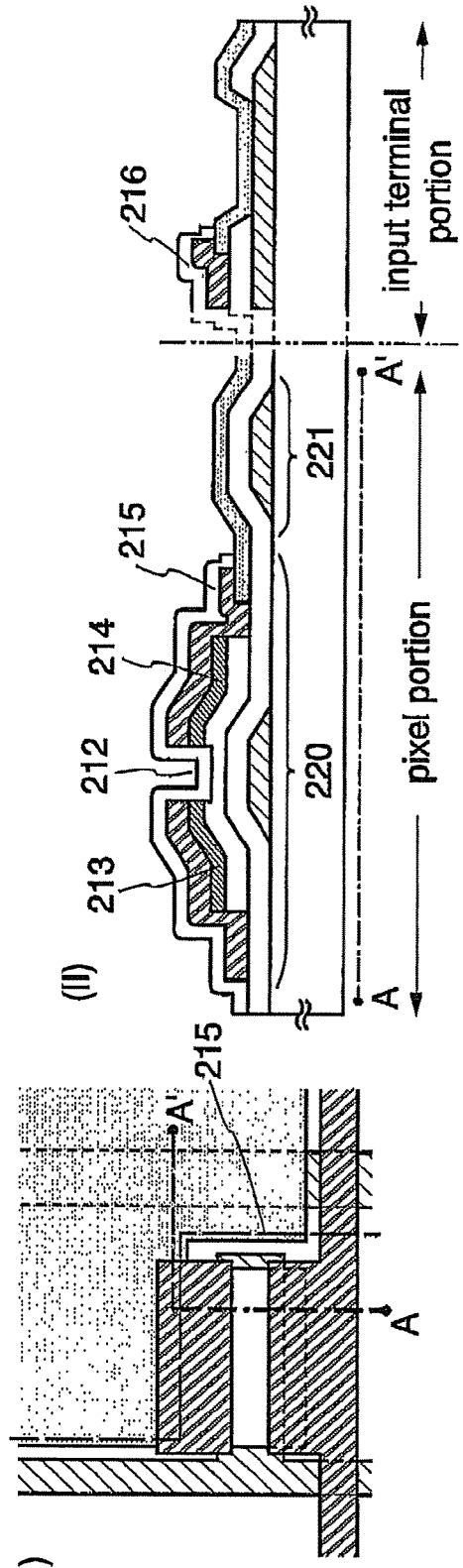
FIG. 4A
FIG. 4B

θ : angle of taper portion

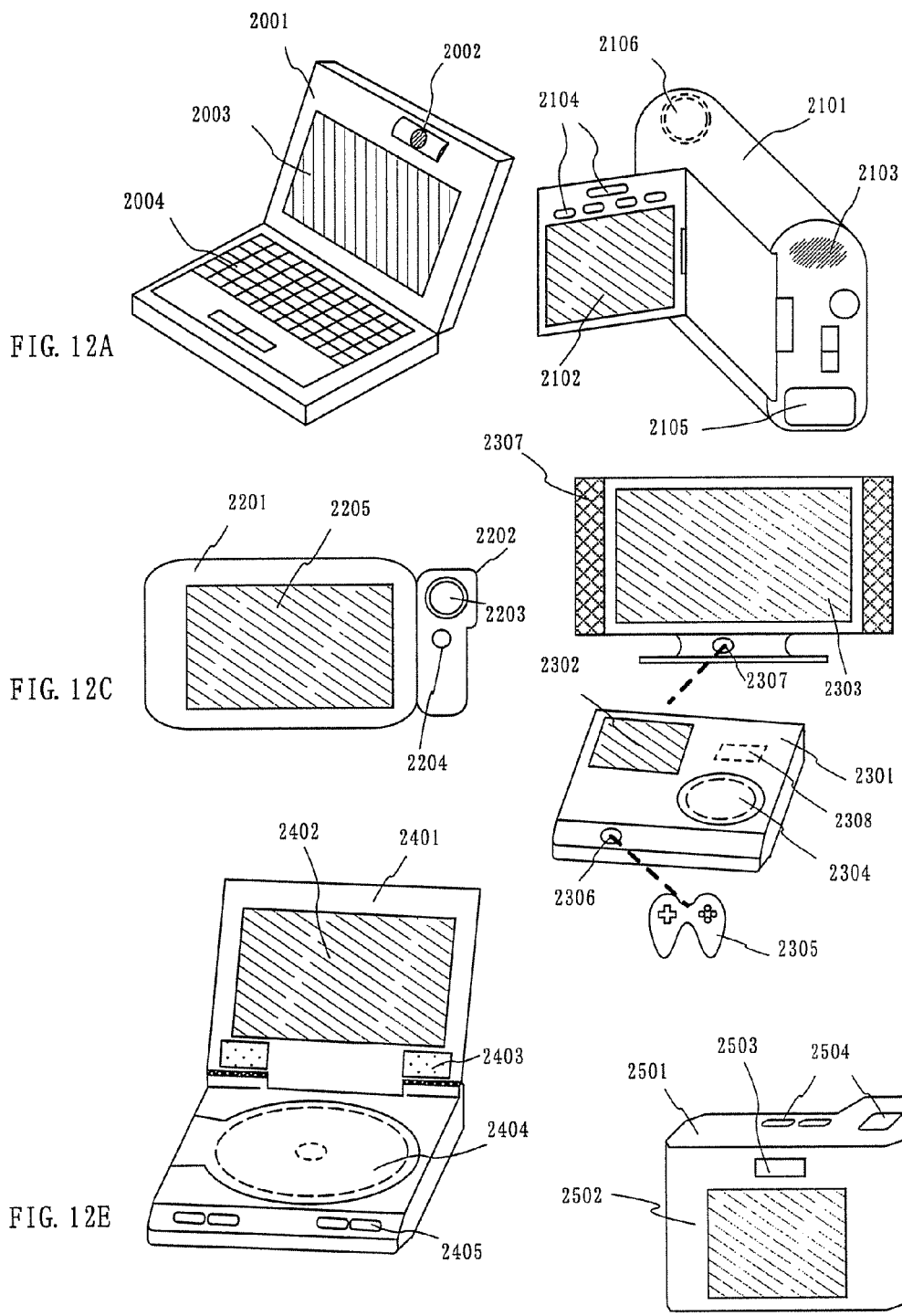

SEMICONDUCTOR DEVICE AND METHOD OF MANUFACTURING THE SEMICONDUCTOR DEVICE

This application is a divisional of U.S. application Ser. No. 09/635,945, filed on Aug. 10, 2000 now abandoned.

BACKGROUND OF THE INVENTION

1. Field of the Invention

The present invention relates to a semiconductor device having a circuit structured by an inverse-stagger type or bottom gate type thin film transistor (hereinafter referred to as "TFT") using a semiconductor film, and a method of manufacturing the semiconductor device. In particular, the present invention relates to a technique which is preferably applicable to an electro-optical device represented by a liquid crystal display device and an electronic device on which the electro-optical device is mounted. In the present invention, the semiconductor device is directed to all of devices that function using the semiconductor characteristics, and the electro-optical device and the electronic device on which the electro-optical device is mounted fall under the category of the semiconductor device.

2. Description of the Related Art

At present, in a note type personal computer (note personal computer) and a portable information terminal, a liquid crystal display device is employed for displaying an image or character information. Since an active matrix liquid crystal display device can obtain a high-fine image as compared with a passive liquid crystal display device, the active matrix liquid crystal display device is preferably employed for the above purpose. The active matrix liquid crystal display device is structured in such a manner that TFTs which function as active elements are arranged in a matrix in correspondence with the respective pixels in a pixel section. Each of those TFTs are normally formed of an n-channel TFT and controls a voltage which is applied to liquid crystal for each of the pixels as a switching element to conduct a desired image display.

There is the inverse-stagger type (or bottom gate type) TFT in which the active layer is formed of an amorphous semiconductor film. The amorphous semiconductor material is preferably formed of an amorphous silicon film. Since the amorphous silicon film can be formed on a large-area substrate at a low temperature of 300° C. or less, it is considered to be a material suitable for mass production. However, the TFT the active layer of which is formed of the amorphous silicon film is small in the field effect mobility to the degree of about 1 cm$^2$/Vsec. Under the above circumstances, the drive circuit for conducting the image display is formed in an LSI chip and mounted by a TAB (tape automated bonding) system or a COG (chip on glass) system.

The active matrix liquid crystal display device thus structured is widely applicable to not only a note personal computer but also a 20-inch grade TV system, and demands for high precision and high aperture ratio have been increasingly raised in order to improve the image quality while a screen size has been large in area. For example, a document of "The Development of Super-High Aperture Ratio with Low Electrically Resistive Material for High-Resolution TFT-LCDs", S. Nakabu, et al., 1999 SID International Symposium Digest of Technical Papers, pp. 732-735 has reported a technique of manufacturing a liquid crystal display device which is UXGA (1600×1200) in pixel density and 20 inches in size.

In order to supply and spread the above-mentioned products on market, there are required to improve the productivity and lower the costs while enhancing the reliability. In the active matrix liquid crystal display device, the TFTs are formed on a substrate by using a plurality of photomasks through the photolithography technique. In order to improve the productivity and also improve the yield, a reduction in the number of processes is considered as effective means. Specifically, it is necessary to reduce the number of photomasks required for manufacturing the TFTs. The photomask is used to form a photo-resist pattern on the substrate with a mask during an etching process in the technique of the photolithography. Therefore, if one photomask is used, there added processes for resist coating, pre-baking, exposing, developing, post-baking, etc., processes for forming a film, etching, etc., which are conducted before and after the former processes and processes for separating the resist, cleaning and drying, etc., resulting in a complicated work.

SUMMARY OF THE INVENTION

The present invention has been made in order to solve the above problems, and therefore an object of the present invention is to realize a reduction of the manufacturing costs and an improvement of the yield by reducing the number of processes for manufacturing the TFTs in an electro-optical device and a semiconductor device which are represented by an active matrix liquid crystal display device.

In order to achieve the above object, according to one aspect of the present invention, there is provided a semiconductor device, comprising:

a first interlayer insulating layer made of an inorganic material and formed on an inverse stagger type (or bottom gate type) TFT with a channel formation region which is formed of a semiconductor layer having an amorphous structure on a substrate;

a second interlayer insulating layer made of an organic material and formed on the first interlayer insulating film;

a pixel electrode formed in contact with the second interlayer insulating layer; and an input terminal portion formed along an end portion of the substrate and electrically connected to a wiring of another substrate;

wherein the input terminal portion includes a first layer made of the same material as that of a gate electrode and a second layer made of the same material as that of the pixel electrode. With the above structure, the number of photomasks used in the photolithography technique is reduced to 5.

According to another aspect of the present invention, there is provided a semiconductor device, comprising:

a first interlayer insulating film made of an inorganic material and formed on an inverse stagger type (or bottom gate type) TFT with a channel formation region which is formed of a semiconductor layer having an amorphous structure on a substrate;

a pixel electrode formed in contact with the first interlayer insulating film formed on a gate electrode of the TFT; and an input terminal portion formed along an end portion of the substrate and electrically connected to a wiring of another substrate;

wherein the input terminal portion includes a first layer made of the same material as that of a gate electrode and a second layer made of the same material as that of the pixel electrode.

According to still another aspect of the present invention, there is provided a method of manufacturing a semiconductor device, comprising:

a first step of forming a gate electrode and a first layer of an input terminal portion which is electrically connected to a wiring on another substrate on a substrate having an insulating surface;

a second step of forming a gate insulating layer on the gate electrode;

a third step of forming a semiconductor layer having an amorphous structure on the gate insulating layer;

a fourth step of forming a semiconductor layer containing one-conductive type impurities therein on the semiconductor layer having the amorphous structure;

a fifth step of forming a source wiring and a drain wiring in contact with the semiconductor layer containing the one-conductive type impurities;

a sixth step of removing parts of the semiconductor layer containing the one-conductive type impurities and the semiconductor layer having the amorphous structure with the source wiring and the drain wiring as masks;

a seventh step of forming a first interlayer insulating layer made of an inorganic material on the source wiring and the drain wiring;

an eighth step of forming a second interlayer insulating layer made of an organic material on the first interlayer insulating layer;

a ninth step of selectively removing the first interlayer insulating layer, the second interlayer insulating layer and the gate insulating layer to expose the first layer of the input terminal portion; and a tenth step forming an pixel electrode and a second layer of the input terminal portion on the second interlayer insulating film.

According to yet still another aspect of the present invention, there is provided a method of manufacturing a semiconductor device, comprising:

a first step of forming a gate electrode and a first layer of an input terminal portion which is electrically connected to a wiring on another substrate on a substrate having an insulating surface;

a second step of forming a gate insulating layer on the gate electrode;

a third step of forming a semiconductor layer having an amorphous structure on the gate insulating layer;

a fourth step of forming a semiconductor layer containing one-conductive type impurities therein on the semiconductor layer having the amorphous structure;

a fifth step of selectively removing the gate insulating layer to expose the first layer of the input terminal portion;

a sixth step of forming a pixel electrode and a second layer of the input terminal portion in contact with the gate insulating layer;

a seventh step of forming a source wiring and a drain wiring in contact with the semiconductor layer containing the one-conductive type impurities;

an eighth step of removing parts of the semiconductor layer containing the one-conductive type impurities and the semiconductor layer having the amorphous structure with the source wiring and the drain wiring as masks; and a ninth step of forming a first interlayer insulating layer made of an inorganic material on the source wiring and the drain wiring.

BRIEF DESCRIPTION OF THE DRAWINGS

These and other objects, features and advantages of this invention will become more fully apparent from the following detailed description taken with the accompanying drawings in which:

FIGS. 1A and 1B are top views and cross-sectional views showing processes of manufacturing a pixel TFT and an input terminal portion;

FIGS. 2A and 2B are top views and cross-sectional views showing processes of manufacturing the pixel TFT and the input terminal portion;

FIGS. 4A and 4B are top views and cross-sectional views showing processes of manufacturing the pixel TFT and the input terminal portion;

FIGS. 12A to 12F are diagrams showing examples of the semiconductor device.

DETAILED DESCRIPTION OF THE PREFERRED EMBODIMENTS

Figure 3A:
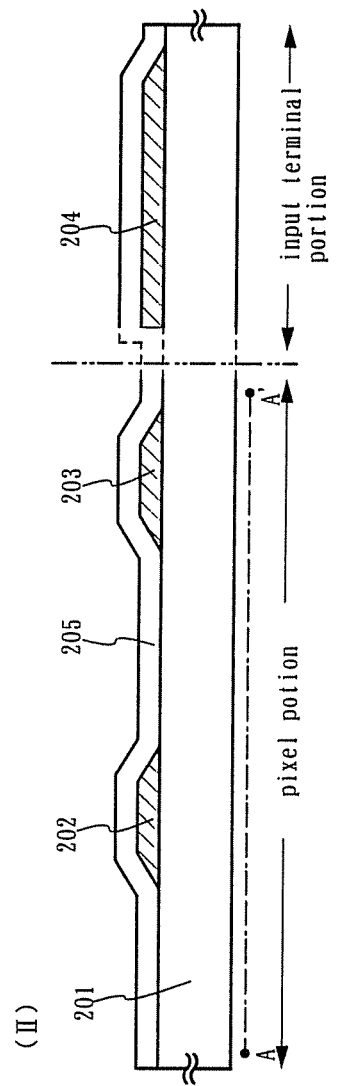
FIGS. 3A and 3B are top views and cross-sectional views showing processes of manufacturing the pixel TFT and the input terminal portion.

Now, a description will be given in more detail of preferred embodiments of the present invention with reference to the accompanying drawings.

First Embodiment

A first embodiment of the present invention will be described with reference to FIGS. 1A, 1B, 2A and 2B. This embodiment shows a method of manufacturing a liquid crystal display device, and a method of Ruining an inverse stagger type TFT of a pixel portion on a substrate and fabricating a storage capacitor connected to the TFT will be described in detail in the order of processes. Also, those figures show a process of fabricating an input terminal portion disposed on an end portion of the substrate for electric connection to a wiring of a circuit disposed on another substrate. In FIGS. 1A, 1B, 2A and 2B, portions (I) show top views whereas portions (II) show cross-sectional views taken along a line A-A'.

Referring to FIG. 1A, a substrate 101 may be made of a glass substrate such as barium boro-silicate glass or alumino boro-silicate glass which is represented by #7059 glass or #1737 glass made by Corning Inc. Alternatively, a stainless substrate or a ceramic substrate on which an oxide silicon film a nitride silicon film or the like is formed, etc., may be employed as the substrate 101.

A gate electrode 102, a gate wiring 102', a storage capacitor wiring 103 and a terminal 104 of an input terminal portion may be desirably made of a low-resistive electrically conductive material such as aluminum (Al). However, since a single substance of Al suffers from such problems that it is low in heat resistance and is liable to be corroded, the above members are made of Al combined with a heat-resistant electrically conductive material. The heat-resistant electrically conductive material may be made of an element selected from titanium (Ti), tantalum (Ta) or tungsten (W), an alloy that contains any one of the above elements, an alloy film that combines the above elements together, or a nitride that contains any one of the above elements. In addition, the above members may be made of the combination of only the above heat-resistant electrically conductive materials.

The selection of the above materials is appropriately determined in accordance with the screen size of the liquid crystal display device. The heat resistant electrically conductive material which is about 10Ω in area resistance and about 5 inches or less in screen size is adaptable to the liquid crystal display device. However, the heat resistant electrically conductive material is not always adaptive to the liquid crystal display device of the screen size more than 5 inches. This is because if the drawing-around length of the gate wiring connected to the gate electrode on the substrate becomes necessarily large, a problem of a wiring delay cannot be ignored. For example, in the case where the pixel density is VGA, 480 gate wirings and 640 source wirings are formed, and in the case where the pixel density is XGA, 768 gate wirings and 1024 source wirings are formed. The resistance of the gate wirings are determined in accordance with the thickness and the width of the wiring in addition to the specific resistance of the material to be used, but naturally limited by the combination with the aperture ratio, and since the pixel density becomes higher, fining is required. In the case where the screen size of the display region is 13 inch class, the length of the diagonal line is 340 mm, and in the case where the screen size is 18 inch class, the length is 460 mm. In this case, in order to realize the liquid crystal display device, it is naturally desirable that the gate wiring is made of a low-resistive electrically conductive material such as Al.

Figure 8A:
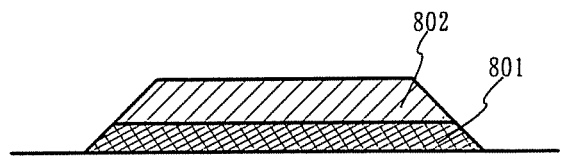
FIGS. 8A and 8B are cross-sectional views for explanation of the structure of a gate electrode.
Figure 8B:
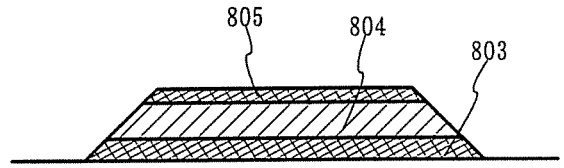

Therefore, the gate electrode and the gate wiring are made of the combination of the heat-resistant electrically conductive material with the low-resistive electrically conductive material. The proper combination of the materials will be described with reference to FIGS. 8A and 8B. If the screen size is 5 inches or less, as shown in FIG. 8A, there is applied a structure of laminating an electrically conductive layer (A) 801 made of nitride of the heat resistant electrically conductive material and an electrically conductive layer (B) 802 made of the heat resistant electrically conductive material. The electrically conductive layer (B) 802 may be made of an element selected from Al, Ta, Ti or W, an alloy that contains any one of the above elements, or an alloy film that combines the above elements together. The electrically conductive layer (A) 801 is formed of a tantalum nitride (TaN) film, a tungsten nitride (WN) film, a titanium nitride (TN) film or the like. Also, as shown in FIG. 8B, an electrically conductive layer (A) 803 made of nitride of a heat-resistant electrically conductive material, an electrically conductive layer (B) 804 made of a low-resistive electrically conductive material and an electrically conductive layer (C) 805 made of nitride of a heat-resistant electrically conductive material are laminated one on another so as to be adaptive to the large screen. The electrically conductive layer (B) 804 made of the low-resistive electrically conductive material is made of a material containing aluminum (Al) and uses 0.01 to 5 atomic % of Al containing scandium (Sc), Ti, silicon (Si) or the like in addition to pure Al. The electrically conductive layer (C) 805 has the effect of preventing hillock from occurring in Al of the electrically conductive layer (B) 804.

In FIG. 8(A), the electrically conductive layer (A) 801 is set to 10 to 100 nm (preferably 20 to 50 nm) in thickness, and the electrically conductive layer (B) 802 is set to 200 to 400 nm (preferably 250 to 350 nm) in thickness. For example, in the case where the W film is formed as the gate electrode, the electrically conductive layer (A) 801 is formed in thickness of 50 nm with a WN film and the electrically conductive layer (B) 802 is formed in thickness of 250 nm with a W film by introducing an Ar gas and nitrogen ($N_2$) gas through the sputtering method with W as a target. However, in order to employ the W film as the gate electrode, it is necessary to lower the resistance, and the resistivity is preferably set to 20 μΩcm or less. The W film can be lowered in resistivity by increasing crystal grains. However, in the case where a large amount of impurity elements such as oxygen are contained in W, crystallization is impeded to make the resistance high. For that reason, in the case of using the sputtering method, a W target with a purity of 99.9999%, and the W film is also formed while satisfactorily paying attention to the impurities being not mixed from a gas phase at the time of forming a film. In particular, it is better that the density of oxygen is set to 30 ppm or less. For example, W can realize the specific resistance of 20 μΩm or less when the density of oxygen is set to 30 ppm or less.

On the other hand, in FIG. 8A, in the case where a TaN film is used for the electrically conductive layer (A) 801, and a Ta film is used for the electrically conductive layer (B) 802, those films can be formed through the sputtering method likewise. The TaN film is formed using a mixture gas of Ar and nitrogen as a sputtering gas and Ta as a target, and the Ta film is formed by using Ar as the sputtering gas. Also, if an appropriate amount of Xe and Kr are added in those sputtering gases, the internal stress of a film to be formed is relieved, thereby being capable of preventing the films from being peeled off. The Ta film of an α-phase is about 20 μΩcm in resistivity and can be used as the gate electrode, but the Ta film of a β-phase is about 180 μΩcm in resistivity and is improper as the gate electrode. Since the TaN film has the crystal structure close to the α-phase, if the Ta film is formed on the TaN film, the Ta film of the α□-phase is readily obtained. In any cases, it is preferable that the electrically conductive layer (B) 802 is formed in the resistivity of 10 to 50 μΩcm.

In the case of the structure shown in FIG. 8B, the electrically conductive layer (A) 803 is set to 10 to 100 nm (preferably 20 to 50 nm) in thickness, the electrically conductive layer (B) 804 is set to 200 to 400 nm (preferably 250 to 350 nm) in thickness, and the electrically conductive layer (C) 805 is set to 10 to 100 nm (preferably 20 to 50 nm) in thickness. In this example, the electrically conductive layer (A) and the electrically conductive layer (C) are formed of a WN film or TaN film of the heat-resistant electrically conductive material, or a Ti film, a Ta film, a W film or the like as described above. The electrically conductive layer (B) 804 is also formed through the sputtering method and formed of 0.01 to 5 atomic % of Al film containing Ti, Si or the like in addition to pure Al.

The gate electrode 102, the gate wiring 102', the storage capacitor wiring 103 and the terminal 104 are formed by conducting a first photolithography process after formation of the electrically conductive layer on the entire substrate surface, forming a resist mask and removing an unnecessary portion by etching. In this situation, etching is conducted in such a manner that a tapered portion is formed on at least an end portion of the gate electrode 102.

Figure 9:
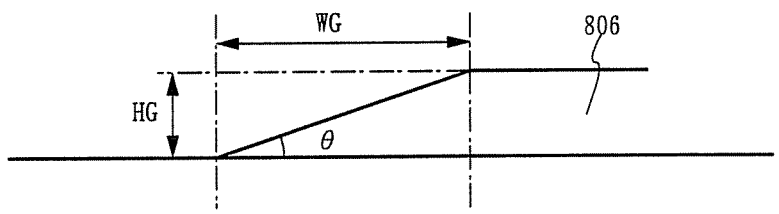
FIG. 9 is a diagram for explanation of a taper structure on an end portion of the gate electrode.

In order to etch the heat-resistant electrically conductive material such as the W film or the Ta film at a high speed and with a high accuracy and to taper the end portion of the material, the dry etching method using the high-density plasma is proper. In order to obtain the high-density plasma, an etching device using micro-waves or inductively coupled plasma (ICP) is proper. In particular, the ICP etching device is easy in the control of plasma and can be adapted to the large area of the substrate to be processed. For example, as the specific etching condition of the W film, the mixture gas of $CF_4$ and $Cl_2$ is used for the etching gas, their flow rates are 30 SCCM, respectively, the discharge power is 3.2 W/cm$^2$ (13.56 MHZ), the substrate bias power is 224 mW/cm$^2$ (13.56 MHZ), and the pressure is 1.0 Pa, under the conditions of which etching is conducted. Under the above conditions, the tapered portion that gradually increases its thickness inwardly from the end portion of the gate electrode 102 is formed at the end portion thereof, and the angle is set to 1 to 20°, more preferably 5 to 15°. As shown in FIG. 9, the angle of the tapered portion on the end portion of the gate electrode 102 is an angle of a portion indicated by θ. The angle θ of the tapered portion is represented by Tan(θ)=HG/WG using the length (WO) of the tapered portion and the thickness (HG) of the tapered portion.

After the gate electrode 102, the gate wiring 102', the storage capacitor wiring 103 and the terminal 104 are formed, an insulating film is formed on the entire surface to provide a gate insulating layer. The gate insulating layer 105 is formed of an insulating film 50 to 200 nm in thickness through the plasma CVD method or the sputtering method. For example, the gate insulating film 105 is formed of a silicon nitrogen oxide film in thickness of 150 mm. Also, since the silicon nitrogen oxide film fabricated by adding $O_2$ to $SiH_4$ and $N_2O$ is reduced in the fixed charge density in the film, it is a preferred material for this application. It is needless to say that the gate insulating layer is not limited to the above silicon nitrogen oxide film, but may be formed of a single layer or a lamination structure made of materials of other insulating films such as a silicon oxide film, a silicon nitride film and a tantalum oxide film. For example, in the case of using the silicon oxide film, the gate insulating layer can be formed by mixing tetraethyl orthosilicate (TEOS) and $O_2$ together and conducting electric discharge at a high frequency (13.56 MHZ) with a power density of 0.5 to 0.8 W/cm$^2$ under the conditions where the reactive pressure is 40 Pa and the substrate temperature is 250 to 350° C. The silicon oxide film thus fabricated can obtain an excellent characteristic as the gate insulating layer by thereafter thermally annealing the silicon oxide film at 300 to 400° C.

Subsequently, a semiconductor layer having an amorphous structure is formed in thickness of 50 to 200 nm (preferably 100 to 150 nm) on the entire surface of the gate insulating layer through a known method such as the plasma CVD method or the sputtering method (not shown). Representatively, an amorphous silicon hydride (a-Si:H) film is formed in thickness of 100 nm through the plasma CVD method. The semiconductor layer having the amorphous structure may be formed of a compound semiconductor film having an amorphous structure such as a micro-crystal semiconductor film or an amorphous silicon germanium film. In addition, as a semiconductor layer containing one-conductive type impurity elements therein, an n-type semiconductor film is formed in thickness of 20 to 80 nm. For example, an n-type a-Si:H film may be formed, and in order to form the film, a phosphine ($PH_3$) 1 to 5% in density is added to silane ($SiH_4$). Alternatively, an n-type semiconductor film may be formed of a micro-crystal silicon hidride film (pc-Si:H).

The gate insulating film, the semiconductor layer having the amorphous structure and the semiconductor layer containing the one-conductive type impurity elements are fabricated by a known method, and may be fabricated by the plasma CVD method or the sputtering method. Those films can be sequentially formed by appropriately switching over the reactive gas if the plasma CVD method is applied, and by appropriately switching over the target and the sputtering gas if the sputtering method is applied. That is, those films can be sequentially laminated without being exposed to the atmosphere by using the same reactive chamber or a plurality of reactive chambers in a plasma CVD device or a sputtering device.

The semiconductor layers thus laminated is patterned in a second photolithography process so that an island-like semiconductor layer is so formed as to be overlapped with the gate electrode 102. The island-like semiconductor layer has an amorphous semiconductor layer 106a and an n-type semiconductor layer 106b.

Then, an electrically conductive metal layer is formed through the sputtering method or the vacuum evaporation method, a resist mask pattern is formed in a third photolithography process, and a source wiring 107, a drain wiring 108 and a storage capacitor wiring 109 are formed by etching as shown in FIG. 2A. Although being not shown, in this embodiment, the wiring is formed in such a manner that a Ti film is formed in thickness of 50 to 150 nm, brought in contact with the n-type semiconductor film that forms the source or drain region of the island-like semiconductor layer, and aluminum (Al) is farmed in thickness of 300 to 400 nm on the Ti film, and another Ti film is formed in thickness of 100 to 150 nm on the aluminum film.

Also, in an input terminal portion connected to the source wiring, a wiring 110 is formed on the gate insulating layer so as to positionally coincide with the input terminal portion. Although this appearance is omitted from FIG. 2A, the wiring 110 extends on the gate insulating layer and is connected to the source wiring.

Using a source wiring 107 and a drain wiring as masks, the n-type semiconductor layer 106b and the amorphous semiconductor layer 106a are partially removed by etching, to thereby form an aperture 111 in the island-like semiconductor layer as shown in the part (II) of FIG. 2A. The aperture 111 allows the n-type semiconductor layer 106b to be divided into a source region 112 and a drain region 113, to thereby form a channel formation region in the island-like semiconductor layer 106 in a self-aligning manner.

Thereafter, as shown in the part (II) of FIG. 2B, a first interlayer insulating layer 114 made of an inorganic material which covers the aperture 111 and comes in contact with at least a part of the channel formation region is formed on the semiconductor layer having the amorphous structure and the n-type semiconductor layer. The first interlayer insulating layer 114 is formed of a silicon oxide film, a silicon nitrogen oxide film, a silicon nitride film or a lamination film combining those films together. The thickness of the first interlayer insulating film 114 is set to 100 to 200 nm. For example, in the case where the first interlayer insulating film 114 is formed of the silicon oxide film, the first interlayer insulating film 114 can be formed by mixing TEOS and $O_2$ together through the plasma CVD method and conducting electric discharge at a high frequency (13.56 MHZ) with a power density of 0.5 to 0.8 W/cm$^2$ under the conditions where the reactive pressure is 40 Pa and the substrate temperature is 200 to 300° C. Also, in the case where the first interlayer insulating film 114 is formed of the silicon nitrogen oxide film, the first interlayer insulating film 114 may be formed of a silicon nitrogen oxide film fabricated by $SiH_4$, $N_2O$ and $NH_3$ through the plasma CVD method or a silicon nitrogen oxide film fabricated by $SiH_4$ and $N_2O$ through the plasma CVD method. In this example, the first interlayer insulating film 114 can be formed at a high frequency (60 MHZ) with a power density of 0.1 to 1.0 W/cm$^2$ under the conditions where the reactive pressure is 20 to 200 Pa and the substrate temperature is 200 to 300° C.

Also, a silicon nitrogen hydrogen oxide film made of $SiH_4$, $N_2O$ and $NH_3$ may be applied to the first interlayer insulating film 114. Similarly, the silicon nitride film can be fabricated by $SiH_4$ and $NH_3$ through the plasma CVD method.

In addition, a second interlayer insulating layer 115 made of an organic material and formed on the first interlayer insulating film 114 is formed in the average thickness of 1.0 to 2.0 µm. The organic resin material may be polyimide, acrylic, polyamide, polyimidamide, BCB (benzocyclobutene) or the like. For example, in the case of using polyimide of the type where the material is thermally polymerized after it is coated on a substrate, polyimide is baked by a clean oven at 200 to 300° C. to form the second interlayer insulating layer 115. Also, in the case of using acrylic, a two-liquid material is used, and after a main material and a curing agent are mixed together, the mixed material is coated on the entire surface of the substrate by using a spinner. Thereafter, the coated material is pre-heated by a hot plate at 80° C. for 60 seconds, and further baked by a clean oven at 180 to 250° C. for 60 minutes, thereby being capable of forming the second interlayer insulating layer 115.

Since the second interlayer insulating film 115 is made of the organic insulating material, the surface can be excellently flattened. Also, since the organic resin material is generally low in permittivity, a parasitic capacitor can be reduced. However, since the organic resin material has the hygroscopic property and is not proper for a protective film, it is preferable that the second interlayer insulating film 115 is combined with the silicon oxide film, the silicon nitrogen oxide film, the silicon nitride film or the like formed as the first interlayer insulating film 114 as in this embodiment.

Thereafter, a fourth photolithography process is conducted to form a resist mask of a predetermined pattern, thereby forming contact holes that reaches the source region or the drain region which is defined in the respective island-like semiconductor layers. The contact holes are formed through the dry etching method. In this case, the second interlayer insulating film 115 made of an organic resin material is first etched by using the mixture gas of $CF_1$, $O_2$ and He as an etching gas, and thereafter the first interlayer insulating film 114 is etched by using $CF_4$ and $O_2$ as an etching gas. On the input terminal portion, the second interlayer insulating film 115, the first interlayer insulating film 114 and the gate insulating layer 105 are partially etched so that the terminal 104 and the wiring 110 are partially exposed.

Figure 11A:
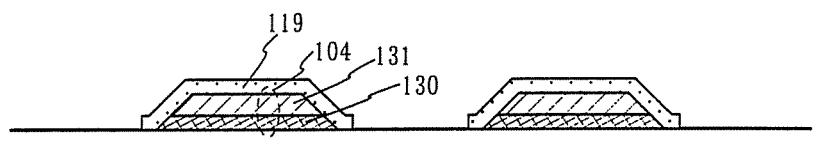
FIGS. 11A and 11B are cross-sectional views for explanation of the structure of the input terminal portion.
Figure 11B:
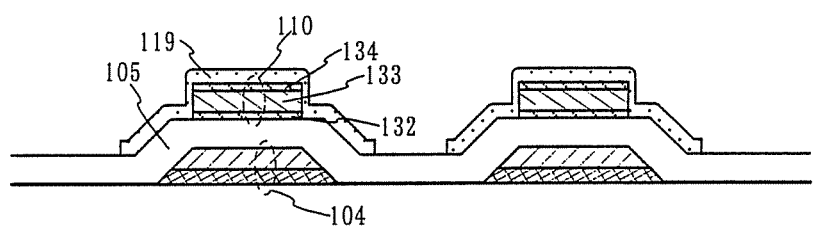

Then, a transparent electrically conductive film is formed in thickness of 50 to 200 nm through the sputtering method or the vapor evaporation method, and a fifth photolithography process is conducted to form a pixel electrode 118 as shown in FIG. 2B. The pixel electrode 118 is connected to the drain wiring 108 on a connecting portion 116 and also connected to the storage capacitor electrode 109 on a connecting portion 117. At the same time, a transparent electrically conductive film 119 is so disposed as to be in contact with at least parts of the terminal 104 and the wiring 110. The detail of a cross-sectional view of the section B-B' which is taken along a direction indicated by an arrow in the part (II) of FIG. 2B is shown in FIG. 11A. In the figure, the gate electrode 104 is formed of an electrically conductive layer (A) 130 and an electrically conductive layer (B) 131, and the transparent electrically conductive film 119 is so formed as to be in contact with at least parts of the electrically conductive layer (A) 130 and the electrically conductive layer (B) 131. Also, the detail of a cross-sectional view of the section C-C' which is taken along a direction indicated by an arrow in the part (II) of FIG. 23 is shown in FIG. 11B. The wiring 110 is of a three-layer structure consisting of a Ti film 132, an Al film 133 and a Ti film 134, and the transparent electrically conductive film 119 is so formed as to be in contact with at least parts of those films. In this way, the terminal 104 and the wiring 110 are electrically connected to each other. However, it is unnecessary to dispose the wiring 110 on the input terminal portion which is connected to the gate wiring, and the transparent electrically conductive film 119 is so disposed as to be in contact with at least a part of the terminal 104.

The transparent electrically conductive film is formed of indium oxide ($In_2O_3$), an alloy of indium oxide and tin oxide ($In_2O_3$—$SnO_2$, ITO for short) or the like through the sputtering method, the vapor evaporation method or the like. The etching process of those materials is conducted by using the solution of hydrochloric acid. However, since the residue is liable to occur particularly in the etching of ITO, an alloy of indium oxide and zinc oxide ($In_2O_3$—ZnO) may be used in order to improve the etching property. Since the alloy of indium oxide and zinc oxide ($In_2O_3$—ZnO) is excellent in surface smoothness and also excellent in heat stability as compared with ITO, even if the terminal 104 is formed of an Al film, corrosion can be prevented. Similarly, zinc oxide (ZnO) is also a proper material, and further zinc oxide (ZnO:Ga) to which gallium (Ga) is added may be employed in order to enhance the transmittance of the visible light and the electric conductivity.

In this way, an inverse stagger type n-channel TFT 120 and a storage capacitor 121 can be completed through the five photolithography processes by using the five photomasks. Those TFTs 120 and capacities 121 are disposed in a matrix in correspondence with the respective pixels to form a pixel portion, thereby being capable of providing one substrate for manufacturing an active matrix liquid crystal display device. In the present specification, the above substrate is called "active matrix substrate" for convenience.

Figure 10:
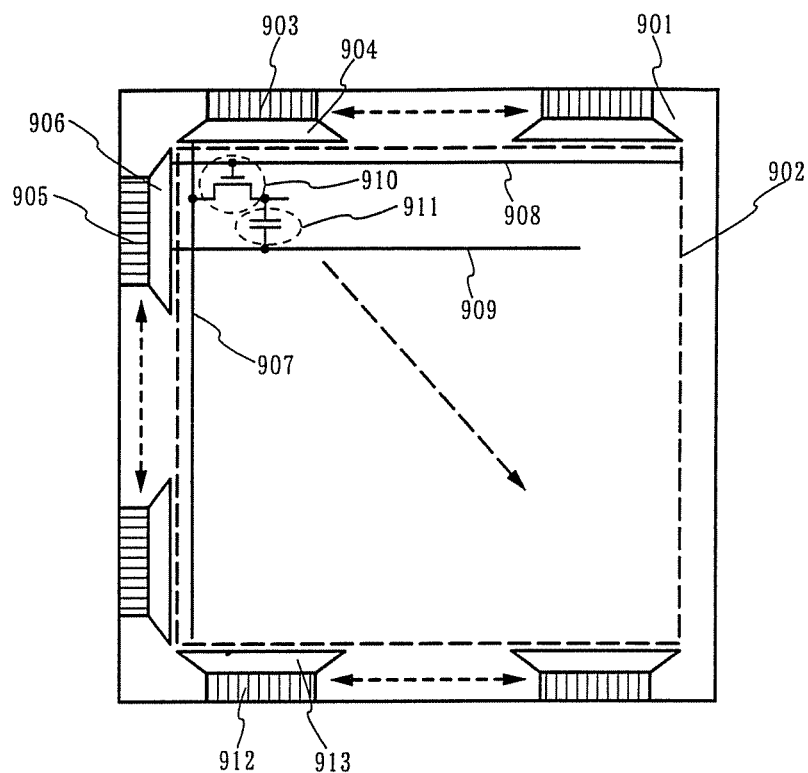
FIG. 10 is a top view for explanation of an arrangement of a pixel portion and an input terminal portion of the liquid crystal display device.

FIG. 10 is a diagram for explanation of an arrangement of a pixel portion and an input terminal portion of the active matrix substrate. A pixel portion 902 is disposed on a substrate 901, and gate wirings 908 and source wirings 907 are disposed on the pixel portion so as to cross each other. The n-channel TFTs 910 which are connected to the gate wirings 908 and the source wirings 907 are disposed in correspondence with the respective pixels. The drain side of the n-channel TFT 910 is connected with one terminal of a storage capacitor 911, and another terminal of the storage capacitor 911 is connected to a storage capacitor wiring 909. The structures of the n-channel TFT 910 and the storage capacitor 911 are identical with those of the n-channel TFT 120 and the storage capacitor 121 shown in FIG. 2B.

One end portion of the substrate is formed with an input terminal portion 905 that inputs a scanning signal, and connected to the gate wiring 908 by a gate wiring 906. Also, another end portion of the substrate is formed with an input terminal portion 903 that inputs an image signal and connected to the source wirings 907 by the connecting wiring 904. The number of gate wirings 908, the number of source wirings 907 and the number of storage capacitor wirings 909 are plural in accordance with the pixel density, and their number is described above. Also, an input terminal portion 912 that inputs the image signal and a connecting wiring 913 may be disposed so that the source wirings are alternately connected to the input terminal portions 912 and 903. The numbers of input terminal portions 903, 905 and 912 may be arbitrarily set and may be appropriately determined by an implementor.

Second Embodiment

A description will be given of a method in which TFTs of the pixel portion are formed in the inverse stagger type on the substrate with a structure different from that in the first embodiment to manufacture the storage capacitor connected to the TFTs with reference to FIGS. 3A to 4B. Similarly, in FIGS. 3A, 3B and FIGS. 4A, 4B, their parts (I) are top views and cross-sectional views taken along a line A-A' are shown by parts (II). The active matrix substrate manufactured by this embodiment corresponds to the transmission-type liquid crystal display device, and hereinafter differences from the first embodiment will be mainly described.

Referring to FIG. 3A, a substrate 201 may be made of a glass substrate such as barium boro-silicate glass or alumino bora-silicate glass which is represented by #7059 glass or #1737 glass made by Corning Inc. Alternatively, a stainless substrate or a ceramic substrate on which an oxide silicon film a nitride silicon film or the like is formed on the surface may be employed as the substrate 201.

A gate electrode 202, a gate wiring 202', a storage capacitor wiring 203 and a terminal 204 of an input terminal portion may be desirably made of the combination of a low-resistive wiring material such as Al with a heat-resistant electrically conductive material. Alternatively, they may be made of the combination of only the heat-resistant electrically conductive materials. For example, a lamination structure of a WN film and a W film may be applied. After the electrically conductive layer with the above structure has been formed on the entire surface of the substrate, a first photolithography process is conducted to form a resist mask, and unnecessary portions are removed by etching to form those components. In this situation, etching is conducted so that a tapered portion is fainted on at least an end portion of the gate electrode 202.

The gate insulating layer 205 is formed of a silicon oxide film, a silicon nitrogen oxide film, a silicon nitride film, a tantalum oxide film or the like in the thickness of 50 to 200 nm through the plasma CVD method or the sputtering method. Subsequently, a semiconductor layer having an amorphous structure is formed in thickness of 50 to 200 nm (preferably 100 to 150 nm) on the entire surface of the gate insulating layer 205 through a known method such as the plasma CVD method or the sputtering method (not shown). Representatively, an amorphous silicon hydride (a-Si:H) film is formed through the plasma CVD method. In addition, as a semiconductor layer containing one-conductive type impurity elements therein, an n-type semiconductor film is formed in thickness of 20 to 80 nm. For example, an n-type a-Si:H film may be formed.

Then, a second photolithography process is conducted on the semiconductor layer thus laminated and formed, and an island-like semiconductor layer 206 is so formed as to be overlapped with the gate electrode 202 as shown in FIG. 2B. The island-like semiconductor layer 206 has an amorphous semiconductor layer 206a and an n-type semiconductor layer 206b.

Subsequently, as shown in the part (II) of FIG. 4A, a third photolithography process is conducted to remove a part of the gate insulating film formed on the terminal 204 by etching, thereby defining an aperture 217. Then, the transparent electrically conductive film is formed in thickness of 50 to 200 nm through the sputtering method, the vapor evaporation method, the spray method or the like, and a transparent electrically conductive film 208 is formed on the pixel electrode 207 and the terminal 217 through a fourth photolithography process.

Thereafter, as in the first embodiment, an electrically conductive layer is formed through the sputtering method or the vapor evaporation method, a resist mask pattern is formed through a fifth photolithography process, and a source wiring 209 and a drain wiring 210 are formed by etching as shown in FIG. 4A. The drain wiring 210 is so formed as to be overlapped with the pixel electrode 207 on its end portion where the drain wiring 210 and the pixel electrode 207 are electrically connected to each other. Also, the connection of the source wiring with the input terminal portion is made such that an end portion 211 of the source wiring extending on the gate insulating film is so formed as to be overlapped with the transparent electrically conductive film 208 and electrically connected to the terminal 204.

The n-type semiconductor layer 206b and the amorphous semiconductor layer 206a are partially removed by etching with the source wiring 209 and the drain wiring 210 as masks, to thereby form an aperture 212 in the island-like semiconductor layer as shown in the part (II) of FIG. 4B. The aperture 212 allows the n-type semiconductor layer 206b to be divided into a source region 213 and a drain region 214, to thereby form a channel formation region in the island-like semiconductor layer 206 in a self-aligning manner.

Thereafter, as shown in the part (II) of FIG. 4B, a first interlayer insulating layer 215 made of an inorganic material which covers the aperture 212 and comes in contact with at least a part of the channel formation region is formed on the semiconductor layer having the amorphous structure and the n-type semiconductor layer. The first interlayer insulating film 215 is formed of a silicon oxide film, a silicon nitrogen oxide film, a silicon nitride film or a lamination film combining those films together. The thickness of the first interlayer insulating film 215 is set to 100 to 200 nm. Then, the first interlayer insulating layer 215 on the pixel electrode 207 and the transparent electrically conductive film 208 of the input terminal portion is removed through a sixth photolithography process.

In this way, an inverse stagger type n-channel TFT 220 and a storage capacitor 221 can be completed through the six photolithography processes by using the six photomasks. The arrangement of the pixel portion and the input terminal portion in the active matrix substrate manufactured in accordance with this embodiment is identical with that in the first embodiment as shown in FIG. 10.

Third Embodiment

The second embodiment shows a method of manufacturing an active matrix substrate adaptive to the transmission type liquid crystal display device, and a third embodiment shows an example adaptive to a reflection type liquid crystal display device.

Figure 3B:
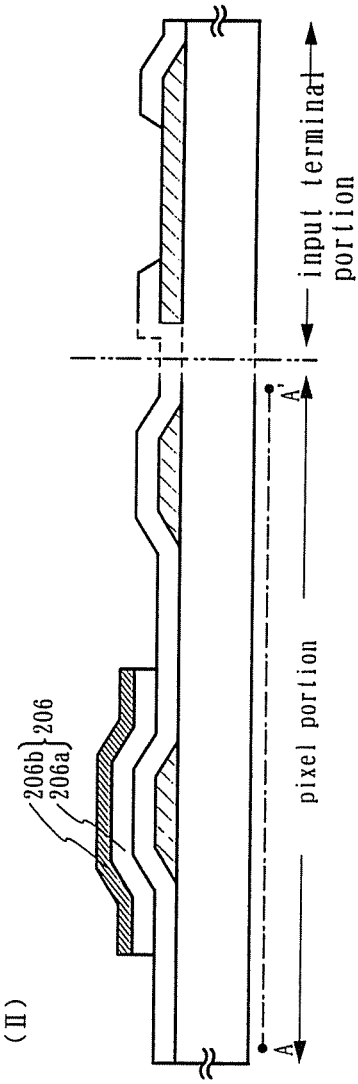
Figure 5:
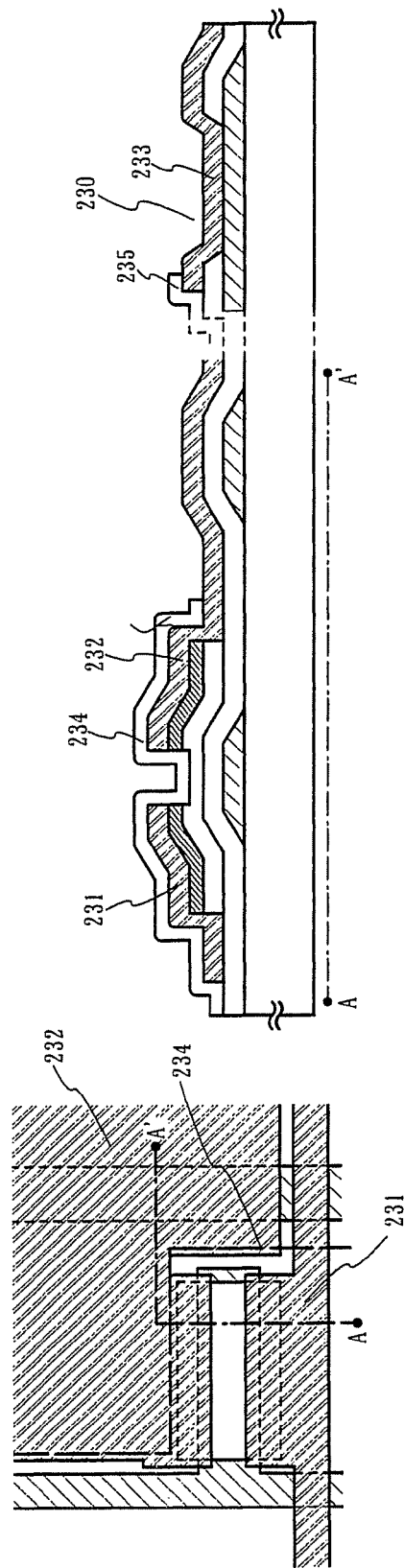
FIG. 5 is a top view and a cross-sectional view showing a process of manufacturing the pixel TFT and the input terminal portion.

First, the processes shown in FIG. 3B are conducted in the same manner as that in the second embodiment. Then, as shown in the part (II) of FIG. 5, a third photolithography process is conducted to remove a part of the gate insulating film disposed on the terminal 204 by etching, to thereby form an aperture 230. Then, an electrically conductive layer is formed through the sputtering method and the vapor evaporation method as in the first embodiment, a resist mask pattern is formed through a fourth photolithography process, and a source wiring 231 and a drain wiring 232 are formed by etching as shown in FIG. 5. The drain wiring 32 serves as a pixel electrode and is so formed as to be overlapped with the storage capacitor wiring 203. Also, the connection of the source wiring to the input terminal portion is made by electric connection with the terminal 204 in the aperture 230.

Thereafter, the first interlayer insulating layer 234 made of an organic material is formed as in the second embodiment. The first interlayer insulating layer 234 on the pixel electrode and the input terminal portion is removed through a fifth photolithography process. In this way, an active matrix substrate adaptive to the reflection type liquid crystal display device can be fabricated by using five photomasks through the five photolithography process.

Fourth Embodiment

Figure 6:
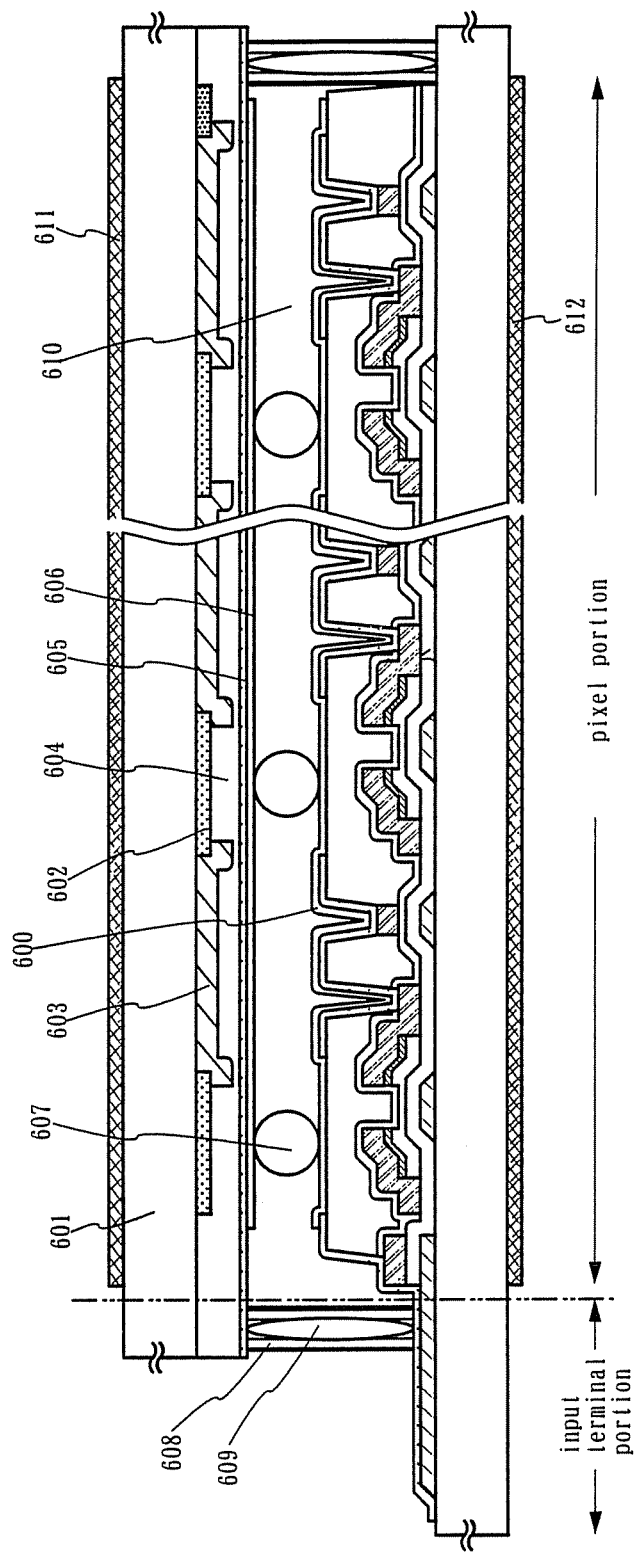
FIG. 6 is a cross-sectional view showing the structure of a liquid crystal display device.

In a fourth embodiment, a description will be given of a process of fabricating an active matrix liquid crystal display device from the active matrix substrate fabricated in the first embodiment. As shown in FIG. 6, an oriented film 600 is formed on an active matrix substrate which is in a state shown in FIG. 2B. Normally, the oriented film of the liquid crystal display device is frequently made of polyimide resin.

A light shielding film 602, a color filter 603 and a flattening film 604, a transparent electrically conductive film 605 and an oriented film 606 are formed on a counter substrate 601 opposite to the oriented film 600. The light shielding film 602 is made of Ti, Al, chrome (Cr) or the like and patterned in accordance with the arrangement of TFTs of the active matrix substrate. Color filters 603 consisting of red, green and blue filters are disposed in correspondence with the respective pixels. The flattening film 604 is formed of an organic resin film and may be made of the same material as that of the second interlayer insulating film used in the first embodiment. After the oriented film has been formed, liquid crystal molecules are subjected to a rubbing process so as to be oriented with a given pre-tilted angle.

Then, the active matrix substrate on which the pixel portion is formed and the counter substrate are bonded together through a spacer 607 by a sealant 608 containing a spacer 609 therein through a known cell assembling process. As a result, a liquid crystal injection region 610 is formed. The liquid crystal material may be a known material and representatively TN liquid crystal. After the injection of the liquid crystal material, an injection port is sealed with a resin material. In case of the transmission type liquid crystal display device, polarizing plates 611 and 612 are bonded together to complete an active matrix liquid crystal display device shown in FIG. 6. In case of the reflection type liquid crystal display device, the polarizing plate 612 is omitted, and the polarizing plate 611 is disposed on only the counter substrate 601 side.

This embodiment shows a method of manufacturing an active matrix liquid crystal display device on the basis of the active matrix substrate fabricated in the first embodiment. However, the active matrix liquid crystal display device can be fabricated in the same manner even if the active matrix substrate shown in the second or third embodiment is employed.

Fifth Embodiment

The active matrix substrate and the liquid crystal display device which are manufactured by implementing the present invention can be applied to various electro-optic devices. Then, the present invention is applicable to all the electronic devices installed with the electro-optic device as a display medium. The electronic device includes a personal computer, a digital camera, a video camera, a portable information terminal (a mobile computer, a portable telephone, an electronic document, etc.), a television, etc.

FIG. 12A shows a personal computer which is made up of a main body 2001 with a microprocessor, a memory and so on, an image input section 2002, a display device 2003 and a key board 2004. The present invention is applicable to the display device 2003.

FIG. 12B shows a video camera which is made up of a main body 2101, a display device 2102, a voice input section 2103, an operating switch 2104, a battery 2105 and an image receiving section 2106. The present invention is applicable to the display device 2102.

FIG. 12C shows a portable information terminal which is made up of a main body 2201, an image input device 2202, an image receiving section 2203, an operating switch 2204 and a display device 2205. The present invention is applicable to the display device 2205.

FIG. 12C shows an electronic play device such as a TV game or a video game, which is made up of an electronic circuit 2308 such as a CPU, a main body 2301 on which a recording medium 2304 is mounted, a controller 2305, a display device 2303, a speaker 2307 and a display device 2302 installed in the main body 2301. The display device 2303 and the display device 2302 installed in the main body 2301 may display the same information, or the former may serve as a main display device whereas the latter may serve as an auxiliary display device so as to display the information of the recording medium 2304, to display the operating state of the device, or provided with the function of a touch sensor to function as an operating board. Also, in order to mutually transmit a signal among the main body 2301, the controller 2305 and the display device 2303, wire communication may be conducted, or wireless communication or optic communication may be conducted with the provision of sensor portions 2306 and 2307. The display device 2303 enables its screen size to increase up to about 30 inches, and can be employed as a television in combination with a tuner not shown.

FIG. 12D shows a player using a recording medium in which program has been recorded (hereinafter referred to as "recording medium") which is made up of a main body 2401, a display device 2402, a speaker portion 2403, a recording medium 2404 and an operating switch 2405. The recording medium may be formed of a DVD (digital versatile disc), a compact disc (CD) or the like so as to conduct the reproduction or an image display of a music program, a video game (or TV game), or information display through the internet, etc. The present invention is preferably applicable to the display device 2402 or other signal control circuits.

FIG. 12E shows a digital camera which is made up of a main body 2501, a display device 2502, an eye-piece portion 2503, an operating switch 2504 and an image receiving portion (not shown). The present invention is applicable to the display device 2502 and other signal control circuits.

Figure 7:
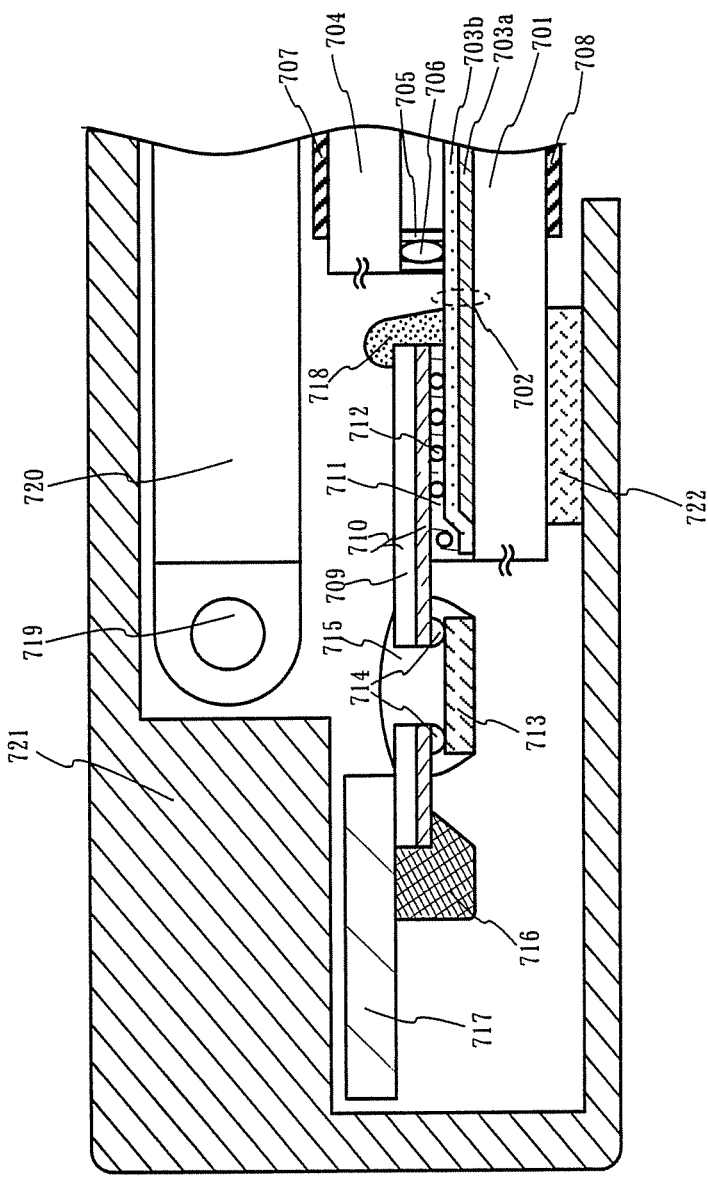
FIG. 7 is a cross-sectional view showing the structure in which the liquid crystal display device is mounted.

FIG. 7 shows an example of a method of mounting the above liquid crystal display device loaded on the electro-optic device. The liquid crystal display device is formed with an input terminal portion 702 on an end portion of a substrate 701 on which TFTs are manufactured, which is formed a terminal 703a made of the same material as that of the gate wiring as described in the first embodiment and a transparent electrically conductive film 703b. Then, the substrate 701 is bonded to a counter substrate 704 with a sealant 705 containing a spacer 706 therein, and polarizing plates 707 and 708 are further disposed. The bonded substrate is fixed to a casing 721 with a spacer 722. A driving circuit is formed in an LSI chip 713 and mounted in the TAB system.

The driving circuit is formed of a flexible printed circuit (FPC), and FPC is produced by forming a copper wiring 710 in an organic resin film 709 such as polyimide and connected to an input terminal 702 with an anisotropic electrically conductive agent. The anisotropic electrically conductive agent is made up of an adhesive 711 and particles 712 having an electrically conductive surface several tens to several hundreds in diameter, which are mixed in the adhesive 711 and plated with gold or the like. The particles 712 are brought in contact with the input terminal 702 and the copper wiring 710 where electric contact is formed. In order to enhance the mechanical strength of that portion, a resin layer 718 is formed.

The LSI chip 713 is connected to the copper wiring 710 with a bump 714 and sealed with a resin material 715. Then the copper wiring 710 is connected to a printed substrate 717 on which a signal processing circuit, an amplifier circuit, a power supply circuit and so on are disposed on a connecting terminal 716. In the transmission type liquid crystal display device, a light source 719 and an optically conductive member 720 are disposed on the counter substrate 704 and used as back-light.

Although being not shown in the above examples, the present invention is applicable to a navigation system, a portable television, and so on. As described above, the present invention is very widely applied and applicable to the electronic devices in any fields. The above electronic devices of this embodiment can be realized by using the techniques of the first to fourth embodiments.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A liquid crystal display device comprising:
    a pixel portion comprising a plurality of pixels over a first substrate, each of the plurality of pixels comprising:
    a thin film transistor comprising a gate electrode, a first insulating layer over the gate electrode, a semiconductor layer over the first insulating layer;
    a source wiring in electrical contact with the semiconductor layer;
    a drain wiring in electrical contact with the semiconductor layer;
    a second insulating layer comprising an inorganic material over the source wiring and the drain wiring;
    a third insulating layer comprising an organic material over the second insulating layer; and
    a pixel electrode over the third insulating layer in electrical contact with one of the source wiring and the drain wiring through a first contact hole of the second insulating layer and a second contact hole of the third insulating layer;
    a first conductive layer over the first substrate, the first conductive layer comprising the same material as the gate electrode;
    an insulating layer over the first conductive layer;
    a second conductive layer over the insulating layer, the second conductive layer comprising the same material as the source wiring and the drain wiring; a third conductive layer over the second conductive layer, the third conductive layer comprising the same material as the pixel electrode, wherein the third conductive layer is in contact with a top surface of the second conductive layer and a top surface and a side surface of the first conductive layer so that the first conductive layer and the second conductive layer are electrically connected to each other;
    a second substrate opposing to the first substrate;
    a fourth insulating layer comprising an organic material under the second substrate;
    a transparent conductive film under the fourth insulating layer; and
    a sealant containing a spacer bonding to the first substrate and the second substrate,
    wherein the sealant is overlapped with the fourth insulating layer and is not overlapped with the third insulating layer.

2. The liquid crystal display device according to claim 1, further comprising:
    a light shielding film between the second substrate and the fourth insulating layer.

3. The liquid crystal display device according to claim 1, wherein the organic material of the third insulating layer is the same as that of the fourth insulating layer.

4. The liquid crystal display device according to claim 1, wherein the organic material of the third insulating layer is a material selected from the group consisting of polyimide, acrylic, polyimide, polyimidamide and benzocyclobutene.

5. The liquid crystal display device according to claim 1, wherein the pixel electrode is a transparent conductive film.

6. The liquid crystal display device according to claim 1, wherein the third insulating layer is a flat surface.

7. The liquid crystal display device according to claim 1, wherein the inorganic material of the second insulating layer is a silicon nitride film.

8. An electronic device having the liquid crystal display device according to claim 1, the electronic device is one selected from the group consisting of a personal computer, a digital camera, a video camera, a mobile computer, a portable telephone, an electronic document, and a television.

9. The liquid crystal display device according to claim 1, further comprising a source region and a drain region over the semiconductor layer.

10. The liquid crystal display device according to claim 1, further comprising a color filter between the second substrate and the fourth insulating layer.

11. An electronic device having the liquid crystal display device according to claim 1, the electronic device further comprises a light source adjacent to the liquid crystal display device.

12. An electronic device having the liquid crystal display device according to claim 1, the electronic device further comprises a flexible printed circuit attached to the liquid crystal display device.

13. The liquid crystal display device according to claim 1, wherein the semiconductor layer is a silicon film.

14. The liquid crystal display device according to claim 1, wherein the semiconductor layer is an amorphous silicon film.

15. The liquid crystal display device according to claim 1, wherein the first conductive layer, the second conductive layer and the third conductive layer are included in an input terminal portion.

16. A display device comprising:
    a pixel portion comprising a plurality of pixels over a first substrate, each of the plurality of pixels comprising:
    a thin film transistor comprising a gate electrode, a first insulating layer over the gate electrode, a semiconductor layer over the first insulating layer;
    a source wiring in electrical contact with the semiconductor layer;
    a drain wiring in electrical contact with the semiconductor layer;

a second insulating layer comprising an inorganic material over the source wiring and the drain wiring;

a third insulating layer comprising an organic material over the second insulating layer; and a pixel electrode over the third insulating layer in electrical contact with one of the source wiring and the drain wiring through a first contact hole of the second insulating layer and a second contact hole of the third insulating layer;

a first conductive layer over the first substrate, the first conductive layer comprising the same material as the gate electrode;

an insulating layer over the first conductive layer;

a second conductive layer over the insulating layer, the second conductive layer comprising the same material as the source wiring and the drain wiring;

a third conductive layer over the second conductive layer, the third conductive layer comprising the same material as the pixel electrode, wherein the third conductive layer is in contact with a top surface of the second conductive layer and a top surface and a side surface of the first conductive layer so that the first conductive layer and the second conductive layer are electrically connected to each other.

17. The display device according to claim 16, wherein the semiconductor layer is an amorphous silicon film.

18. The display device according to claim 16, wherein the display device is a liquid crystal device.

19. The display device according to claim 16, wherein the organic material of the third insulating layer is a material selected from the group consisting of polyimide, acrylic, polyamide, polyimidamide and benzocyclobutene.

20. The display device according to claim 16, wherein the pixel electrode is a transparent conductive film comprising indium oxide and zinc oxide.

21. The display device according to claim 16, wherein the third insulating layer is a flat surface.

22. The display device according to claim 16, wherein the inorganic material of the second insulating layer is a silicon nitride film.

23. An electronic device having the display device according to claim 16, the electronic device is one selected from the group consisting of a personal computer, a digital camera, a video camera, a mobile computer, a portable telephone, an electronic document, and a television.

24. The display device according to claim 16, further comprising a source region and a drain region over the semiconductor layer.

25. The display device according to claim 16, further comprising a color filter between the second substrate and the fourth insulating layer.

26. An electronic device having the display device according to claim 16, the electronic device further comprises a flexible printed circuit attached to the liquid crystal display device.

27. The display device according to claim 16, wherein the semiconductor layer is a silicon film.

28. The display device according to claim 16, wherein the first conductive layer, the second conductive layer and the third conductive layer are included in an input terminal portion.

* * * * *

UNITED STATES PATENT AND TRADEMARK OFFICE
CERTIFICATE OF CORRECTION

| | | |
|---|---|---|
| PATENT NO. | : 8,654,270 B2 | Page 1 of 1 |
| APPLICATION NO. | : 12/199086 | |
| DATED | : February 18, 2014 | |
| INVENTOR(S) | : Setsuo Nakajima et al. | |

It is certified that error appears in the above-identified patent and that said Letters Patent is hereby corrected as shown below:

In the Specification:

Column 4, Line 44; Change "Ruining" to --forming--.

Column 5, Line 49; Change "(TN)" to --(TiN)--.

Column 7, Line 16; Change "(WO)" to --(WG)--.

Column 7, Line 25; Change "150 mm." to --150 nm.--.

Column 7, Line 60; Change "(pc-Si:H)." to --($\mu$c-Si:H).--.

Column 8, Line 23; Change "farmed" to --formed--.

Column 9, Line 39; Change "$CF_1$," to --$CF_4$,--.

Column 9, Line 66; Change "FIG. 23" to --FIG. 2B--.

Column 11, Line 12; Change "bora-silicate" to --boro-silicate--.

Column 11, Line 29; Change "fainted" to --formed--.

In the Claims:

Column 16, Line 22, Claim 4; Change "polyimide," to --polyamide,--.

Signed and Sealed this
First Day of July, 2014

Michelle K. Lee
*Deputy Director of the United States Patent and Trademark Office*